(12) United States Patent
Seo

(10) Patent No.: US 11,912,198 B2
(45) Date of Patent: Feb. 27, 2024

(54) DISPLAY DEVICE AND VEHICLE HAVING THE SAME

(71) Applicant: Samsung Display Co., LTD., Yongin-si (KR)

(72) Inventor: Hae Kwan Seo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 185 days.

(21) Appl. No.: 17/234,197

(22) Filed: Apr. 19, 2021

(65) Prior Publication Data
US 2022/0024383 A1    Jan. 27, 2022

(30) Foreign Application Priority Data
Jul. 23, 2020    (KR) ........................ 10-2020-0091498

(51) Int. Cl.
| | |
|---|---|
| *H04N 7/18* | (2006.01) |
| *B60R 1/00* | (2022.01) |
| *G02B 5/00* | (2006.01) |
| *G02B 26/04* | (2006.01) |
| *G02B 17/08* | (2006.01) |
| *G09G 3/32* | (2016.01) |
| *H01L 27/15* | (2006.01) |
| *H01L 25/075* | (2006.01) |
| *H10K 59/35* | (2023.01) |

(52) U.S. Cl.
CPC ................ *B60R 1/00* (2013.01); *G02B 5/005* (2013.01); *G02B 17/08* (2013.01); *G02B 26/04* (2013.01); *G09G 3/32* (2013.01); *H04N 7/18* (2013.01); *B60R 2300/10* (2013.01); *B60R 2300/20* (2013.01); *G09G 2300/0452* (2013.01); *G09G 2310/08* (2013.01); *G09G 2380/10* (2013.01); *H01L 25/0753* (2013.01); *H01L 27/156* (2013.01); *H10K 59/352* (2023.02); *H10K 59/353* (2023.02)

(58) Field of Classification Search
CPC ... B60R 1/00; B60R 2300/10; B60R 2300/20; G02B 5/005; G02B 17/08; G02B 26/04; H04N 7/18; G09G 3/32; G09G 2300/0452; G09G 2310/08; G09G 2380/10; H01L 25/0753; H01L 27/156; H01L 27/3216; H01L 27/3218
USPC ........................................................ 348/148
See application file for complete search history.

(56) References Cited

U.S. PATENT DOCUMENTS

| | | | | |
|---|---|---|---|---|
| 7,432,800 | B2 * | 10/2008 | Harter, Jr. ............. | B60Q 9/008 340/436 |
| 9,242,603 | B2 * | 1/2016 | Kwon .................... | H04N 7/181 |
| 10,414,328 | B2 * | 9/2019 | Kim ..................... | B60Q 1/1492 |

(Continued)

FOREIGN PATENT DOCUMENTS

KR    10-1816423    1/2018

*Primary Examiner* — Trang U Tran
(74) *Attorney, Agent, or Firm* — KILE PARK REED & HOUTTEMAN PLLC

(57) ABSTRACT

A display device includes a light collector including a camera unit having a camera and a window unit having a window, an optical unit that controls a path of light received from the window unit, and a transparent display panel including at least one pixel area that displays an image based on an image captured by the camera unit and at least one transmissive area that displays an image received from the optical unit.

17 Claims, 14 Drawing Sheets

(56) References Cited

U.S. PATENT DOCUMENTS 11,469,275 B2 * 10/2022 Wu ................... H01L 27/3234
2008/0151048 A1 * 6/2008 Watanabe ................ B60R 1/00
  348/143

* cited by examiner

DISPLAY DEVICE AND VEHICLE HAVING THE SAME

CROSS-REFERENCE TO RELATED APPLICATION(S)

This application claims priority to and benefits of Korean Patent Application No. 10-2020-0091498 under 35 U.S.C. § 119, filed on Jul. 23, 2020, in the Korean Intellectual Property Office, the entire contents of which are incorporated herein by reference.

BACKGROUND

1. Technical Field

The disclosure relates to a display device and a vehicle including the same.

2. Description of the Related Art

A vehicle includes side mirrors that allow a driver to observe and monitor objects and obstacles around the vehicle for safe driving. The side mirrors are essential for safe driving as they provide the driver with information on other vehicles, dynamic objects, or surrounding structures located on the rear and side of the vehicle.

Since the side mirrors protrude from both sides of the front of the vehicle, they may be broken if the vehicle collides with another vehicle or an object during traveling or parking. The side mirrors may increase air resistance in a case that the vehicle travels, thereby reducing fuel economy and increasing exhaust gas emission. In addition, the side mirrors may deteriorate the aesthetics of vehicle design.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that may eliminate side mirrors and may provide rear and side views of a vehicle even in a case that the vehicle or the system is not operated, and a vehicle including the same.

It should be noted that objects of the disclosure are not limited to the above-mentioned objects. Other objects of the disclosure will be apparent to those skilled in the art from the following descriptions.

According to an embodiment, a display device may include a light collector comprising a camera unit having a camera; and a window unit having a window; and an optical unit that controls a path of light received from the window unit; and a transparent display panel comprising at least one pixel area that displays an image based on an image captured by the camera unit, and at least one transmissive area that displays an image received from the optical unit.

The window unit may be closed when the camera unit is operated and may be open when the camera unit is not operated.

The window unit may comprise a shield disposed between the window of the window unit and the optical unit, and the shield may close the window unit based on an operation of the camera unit.

The window unit may further comprise an iris diaphragm disposed between the shield and the optical unit, and the iris diaphragm may control an amount of light collected through the window of the window unit.

The optical unit may comprise a first lens concentrating the light received from the window unit; a light path controller controlling a path of light having passed through the first lens; a second lens concentrating the light having passed through the light path controller; and a reflective member reflecting the light having passed through the second lens.

The light path controller may comprise a first surface transmitting light incident in a first direction through the first lens; a second surface reflecting the light having passed through the first surface in a third direction between a second direction perpendicular to the first direction and an opposite direction to the first direction; a third surface reflecting the light reflected off of the second surface in an opposite direction to the second direction; and a fourth surface transmitting the light reflected off of the third surface toward the second lens.

The reflective member may reflect light incident in the opposite direction to the second direction in the opposite direction to the first direction.

The at least one transmissive area may receive the light incident from the reflective member to display an image.

The display device may further comprise a display driver that may drive the at least one pixel area based on image data captured by the camera unit.

The window unit may be closed when the display driver is operated and may be open when the display driver is not operated.

The display driver may comprise a timing controller that may receive the image data and generate first to third timing signals; a data driver that may receive the image data and the first timing signal from the timing controller and supply a data voltage to the at least one pixel area; a scan driver that may receive the second timing signal from the timing controller and supply a scan signal to the at least one pixel area; and an emission control driver that may receive the third timing signal from the timing controller and supply an emission control signal to the at least one pixel area.

The at least one pixel area may comprise a plurality of pixel areas spaced apart from one another. Each of the plurality of pixel areas may comprise a first pixel that emits a first color light; a second pixel that emits a second color light, the second pixel being adjacent to the first pixel in a first direction or in a second direction perpendicular to the first direction; and a third pixel that emits a third color light, the third pixel being adjacent to the first pixel in a third direction between the first direction and the second direction. The at least one transmissive area may comprise a plurality of transmissive areas, and the plurality of transmissive areas may surround each of the plurality of pixel areas.

The at least one pixel area may comprise a plurality of pixel areas spaced apart from one another. Each of the plurality of pixel areas may comprise a first pixel that emits a first color light; a second pixel that emits a second color light, the second pixel being adjacent to the first pixel in a first direction and a third pixel that emits a third color light, the third pixel being adjacent to each of the first pixel and the second pixel in a second direction perpendicular to the first direction. The at least one transmissive area may comprise a plurality of transmissive areas, and the plurality of transmissive areas may surround the plurality of pixel areas.

The at least one pixel area may comprise a plurality of pixel areas spaced apart from one another. Each of the plurality of pixel areas may comprise a first pixel that emits a first color light; a second pixel that emits a second color light, the second pixel being adjacent to the first pixel in a first direction; and a third pixel that emits a third color light, the third pixel being adjacent to the second pixel in the first direction. The at least one transmissive area may comprise a plurality of transmissive areas, and the plurality of transmissive areas may surround each of the plurality of pixel areas.

According to an embodiment, a vehicle may include a side door; and a display device that displays images on an outside of the side door of the vehicle. The display device may comprise a light collector comprising a camera unit having a camera and a window unit having a window, the light collector being disposed on an outer side of the side door of the vehicle; an optical unit that controls a path of light received from the window unit of the light collector; and a transparent display panel comprising a pixel area that displays an image based on an image captured by the camera unit and a transmissive area that displays an image received from the optical unit, the transparent display panel being disposed on an inner side of the side door of the vehicle.

The optical unit may comprise a first lens concentrating light outside of the side door that may be received from the window unit; a light path controller controlling a path of light having passed through the first lens; a second lens concentrating the light having passed through the light path controller; and a reflective member reflecting the light having passed through the second lens.

The light path controller may comprise a first surface transmitting light incident in a first direction through the first lens; a second surface reflecting the light having passed through the first surface in a third direction between a second direction perpendicular to the first direction and an opposite direction to the first direction; a third surface reflecting the light reflected off of the second surface in an opposite direction to the second direction; and a fourth surface transmitting the light reflected off of the third surface toward the second lens.

The reflective member may reflect the light incident from the second lens to supply the reflected light to the transparent display panel disposed on the inner side of the side door of the vehicle.

The window unit may be closed when the camera unit is operated and may be open when the camera unit is not operated.

The display device may further comprise a display driver that drives the pixel area based on the image data captured by the camera unit. The window unit may be closed when the display driver is operated and may be open when the display driver is not operated.

According to an embodiment, a display device in a vehicle may include a camera unit of a light collector, a display driver, and pixel areas of a transparent display panel, so that rear and side views of the vehicle may be obtained even without side mirrors. For example, since the display device and the vehicle including the same may include no side mirror, it may be possible to reduce the chances that the vehicle collides with another vehicle or object during traveling or parking. Further, fuel economy may be increased by reducing air resistance, and the aesthetics of vehicle design may be improved.

According to an embodiment, a display device in a vehicle may include a window unit of a light collector, an optical unit and transmissive areas of a transparent display panel, so that rear and side views of the vehicle may be obtained even without side mirrors and even in a case that the vehicle or the system of the vehicle is not operated. Even in a case that the vehicle is turned off or the camera unit, the display driver or the pixel areas may not be operated normally, the display device and the vehicle including the display device may provide the driver with rear and side views of the vehicle. For example, since the display device and the vehicle including the same may include no side mirror, it may be possible to reduce the chances that the vehicle collides with another vehicle or object during traveling or parking. Further, fuel economy may be increased by reducing air resistance, and the aesthetics of vehicle design may be improved.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
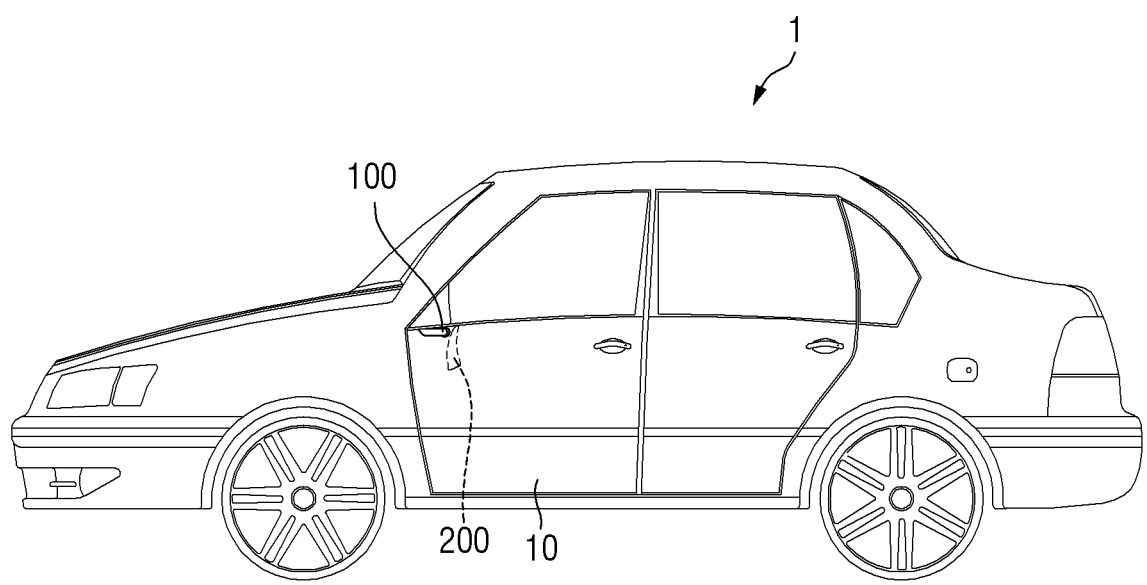
FIG. 1 is a side view showing a vehicle according to an embodiment.

In the following description, for the purposes of explanation, numerous details are set forth in order to provide a thorough understanding of various embodiments or implementations. As used herein "embodiments" and "implementations" are interchangeable words that are non-limiting examples of devices or methods employing one or more of the embodiments or implementations disclosed herein. It is apparent, however, that various embodiments may be practiced in addition to the above details or with one or more equivalent arrangements. In other instances, structures and devices are shown in block diagram form in order to avoid unnecessarily obscuring various embodiments. Further, various embodiments may be different, but do not have to be exclusive. For example, shapes, configurations, and characteristics of an embodiment may be used or implemented in an embodiment without departing from the spirit and the scope of the disclosure.

Unless otherwise specified, the illustrated embodiments are to be understood as providing examples of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one or an elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features may then be oriented "above" the other elements or features. Thus, the example term "below" can encompass both an orientation of above and below. Furthermore, the apparatus may be otherwise oriented (for example, rotated 90 degrees or at other orientations), and, as such, the spatially relative descriptors used herein interpreted accordingly.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "have" and/or "having" and their variations when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some functions and a processor (for example, one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
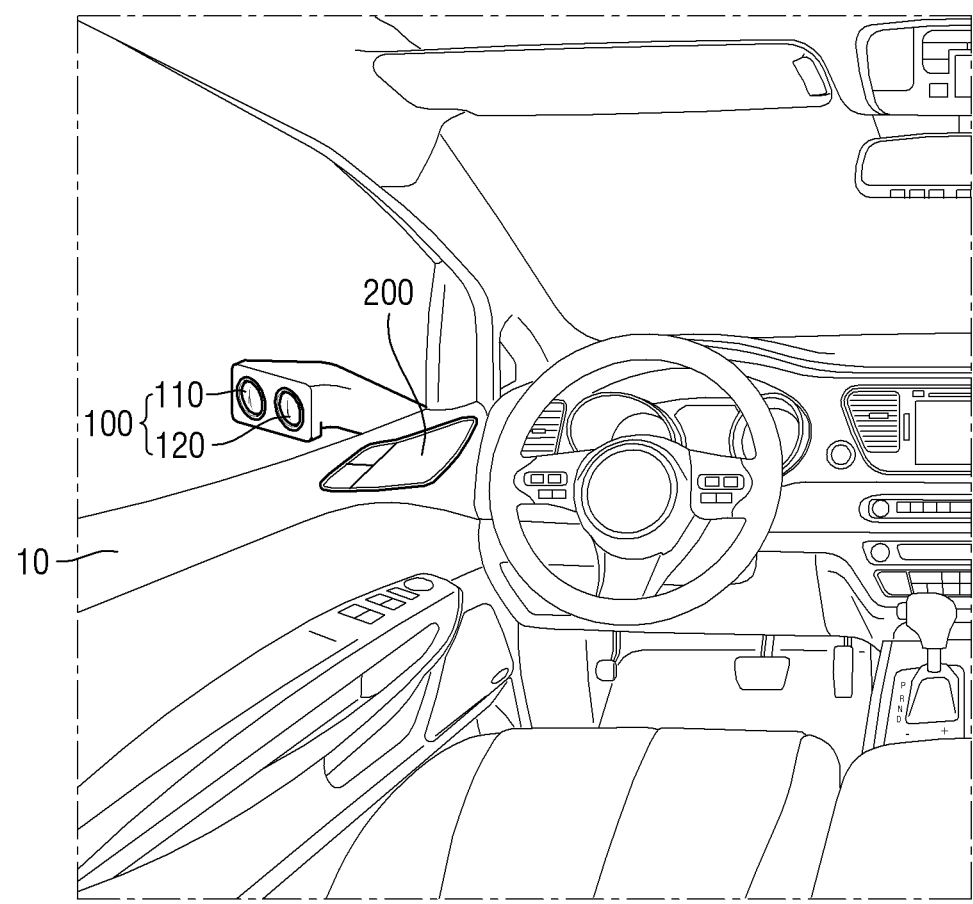
FIG. 2 is a perspective view showing the interior of a vehicle according to an embodiment.
Figure 3:
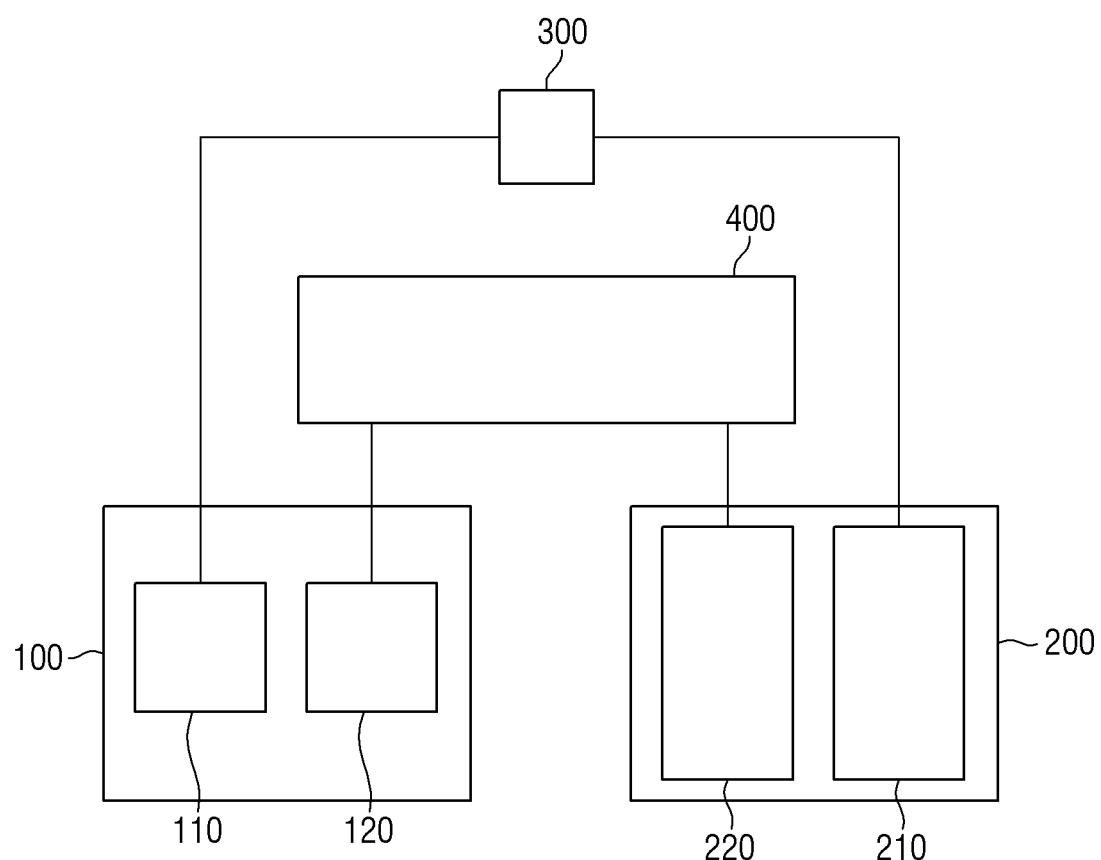
FIG. 3 a block diagram illustrating a display device according to an embodiment.

FIG. 1 is a side view showing a vehicle according to an embodiment. FIG. 2 is a perspective view showing the interior of a vehicle according to an embodiment. FIG. 3 a block diagram illustrating a display device according to an embodiment.

Referring to FIGS. 1 to 3, a vehicle 1 may include a side door 10 and a display device that displays images on the outside of the side door 10.

The side door 10 may refer to an entrance through which a driver or a passenger of the vehicle may get on/off the vehicle. The side door 10 is closed while the vehicle is traveling and thus may separate the interior of the vehicle from the exterior.

The display device may provide a driver on the vehicle with images on the outside of the side door 10. Since the vehicle 1 may include the display device, it may be possible to obtain the rear and side views of the vehicle without additional side mirrors. The display device may include a light collector 100, a transparent display panel 200, a display driver 300, and an optical unit 400.

The light collector 100 may include a camera unit 110 and a window unit 120. The light collector 100 may protrude from the vehicle 1 or the side door 10. The camera unit 110 and the window unit 120 may be disposed toward the rear or the rear and side of the vehicle 1. For example, the light collector 100 may be disposed on the outer side of the side door 10 and may be spaced apart from the window of the side door 10. Alternatively, the light collector 100 may be disposed at a position outside the vehicle 10 that may be spaced apart from the side door 10, so that it may be free from the opening and closing operation of the side door 10.

The light collector 100 may have a structure and size that may minimize air resistance in a case that the vehicle is traveling. For example, the light collector 100 may protrude from the vehicle 1 to the extent that it is difficult to observe it from a distance, and may have a small size to minimize air resistance.

The camera unit 110 may be disposed on each of both the sides in front of the vehicle 1. The camera unit 110 may be disposed on the outer side of the side door 10 and may include a camera to capture images on the rear and side of the vehicle 1. The camera of the camera unit 110 is implemented as a small, wide-angle module, so that the size may be reduced relatively and a larger area may be captured. For example, the camera unit 110 may be disposed obliquely toward the outside of the vehicle 1 so that it faces the rear and side of the vehicle 1. It is, however, to be understood that the disclosure is not limited thereto.

For example, the camera unit 110 may be operated by receiving power from the vehicle 1 or the display driver 300. Alternatively, the camera unit 110 may include a power supply module therein to supply power on its own. The camera unit 110 may receive a capture signal from the vehicle 1 or the display driver 300 to capture images on the rear and side of the vehicle 1.

The window unit 120 may be disposed on each of both the sides in front of the vehicle 1. The window unit 120 and the camera unit 110 may be disposed side-by-side and may collect light incident through the window from the rear and side of the vehicle 1. The window unit 120 may supply light incident from the rear and side of the vehicle 1 to the optical unit 400. For example, the window unit 120 may be disposed obliquely toward the outside of the vehicle 1 so that it faces the rear and side of the vehicle 1. It is, however, to be understood that the disclosure is not limited thereto.

The window unit 120 may be closed while the camera unit 100 is operated and may be open while the camera unit 110 is not operated.

In a case that the camera unit 110 receives a capture signal from the vehicle 1 or the display driver 300 to capture images on the outside, the window unit 120 may be closed and thus may not collect external light. The display driver 300 may drive a pixel area 210 based on the image data captured by the camera unit 110. In this case, the optical unit 400 cannot receive light from the window unit 120, and thus a transmissive area 220 of the transparent display panel 200 may not display an image. Accordingly, the pixel area 210 of the transparent display panel 200 may display images on the outside based on the image captured by the camera unit 110, and the transmissive area 220 may not display images on the outside.

In a case that the camera unit 110 does not receive a capture signal from the vehicle 1 or the display driver 300 and thus is not operated, the window unit 120 may be open to collect external light. The optical unit 400 may control a path of light received by the window unit 120 and supply it to the transmissive area 220 of the transparent display panel 200. In this case, the display driver 300 may not be operated, and the pixel area 210 of the transparent display panel 200 may not display an image. Accordingly, the transmissive area 220 of the transparent display panel 200 may display images on the outside based on the light received by the window unit 120, and the pixel area 210 may not display images on the outside.

The transparent display panel 200 may be a light-emitting display panel including light-emitting elements. For example, the transparent display panel 200 may be an organic light-emitting display panel using organic light-emitting diodes including organic emissive layer, a micro light-emitting diode display panel using micro LEDs, a quantum-dot light-emitting display panel using quantum-dot light-emitting diodes including a quantum-dot emissive layer, or an inorganic light-emitting display panel using inorganic light-emitting elements including an inorganic semiconductor.

The transparent display panel 200 may be disposed inside the vehicle 1 or the side door 10 to display images on the outside. The transparent display panel 200 may be implemented to be transparent, so that light incident on the transparent display panel 200 may be transmitted. For example, the transparent display panel 200 may be disposed on one or a side of a driver's seat adjacent to the side door 10 to display images on the outside. In this case, the transparent display panel 200 may display images on the outside regardless of the opening and closing of the side door 10. Alternatively, the transparent display panel 200 may be disposed on the inner side of the side door 10 to display images on the outside. In this case, the transparent display panel 200 may be moved as the side door 10 is opened and closed. The transparent display panel 200 may include pixel areas 210 and transmissive areas 220.

Each of the pixel areas 210 may include a plurality of pixels. The pixel areas 210 may occupy a predetermined area of the transparent display panel 200. For example, in a case that the pixel areas 210 may be increased, the transmissive areas 220 may be decreased, and the overall luminance of the pixel areas 210 of the transparent display panel 200 may be increased. In a case that the overall luminance of the pixel areas 210 increases, images on the outside by the camera unit 110 may be displayed brightly and clearly. For another example, in a case that the pixel areas 210 may be decreased, the transmissive areas 220 may be increased, and the transmittance of the transparent display panel 200 may be increased. In a case that the transmittance of the transparent display panel 200 is increased, images on the outside by the window unit 120 may be displayed brightly and clearly. Accordingly, the ratio of the pixel areas 210 and the transmissive areas 220 may be changed depending on various factors and conditions of the vehicle 1 or the display device.

A plurality of pixels of the pixel areas 210 may be driven by the display driver 300. The pixel areas 210 may receive a data voltage, a driving voltage, a scan signal and an emission control signal from the display driver 300. The data voltage applied to the pixel areas 210 may include information regarding images on the outside of the vehicle 1. The pixel areas 210 may display the images captured by the camera unit 110 and provide it to the driver. The pixel areas 210 may not display an image in a case that the camera unit 110 or the display driver 300 is not operated.

The transmissive areas 220 may display images on the outside using light that has passed through the window unit 120 and the optical unit 400. External light may reach the optical unit 400 through the window unit 120, and the optical unit 400 may control the path of light to supply it to the transparent display panel 200. The transmissive areas 220 may transmit light supplied to the transparent display panel 200 to provide images on the outside to the driver. The transmissive areas 220 may not display an image in a case that the window unit 120 is closed.

The display driver 300 may drive the pixel areas 210 based on the image data captured by the camera unit 110. The display driver 300 may output signals and voltages for driving the pixel areas 210 of the transparent display panel 200. The display driver 300 may supply a data voltage to a data line of the transparent display panel 200 and may supply a driving voltage to a voltage supply line of the transparent display panel 200. The display driver 300 may supply a scan signal to a scan line of the transparent display panel 200 and may supply an emission control signal to an emission control line of the transparent display panel 200. The display driver 300 may be disposed inside the vehicle 1 or on one or a side of the transparent display panel 200.

For example, the display driver 300 may determine an operation of the camera unit 110. The display driver 300 may receive a capture signal from the vehicle 1 and supply it to the camera unit 110. In a case that the camera unit 110 captures an image on the rear and side of the vehicle 1 based on a capture signal, the display driver 300 may receive image data from the camera unit 110 to drive the pixel area 210.

The optical unit 400 may control the path of light received by the window unit 120 and supply it to the transparent display panel 200. The optical unit 400 may change the path of light received from the window unit 120 disposed outside the vehicle 1 or the side door 10, and may supply the light to the transparent display panel 200 disposed inside the vehicle 1 or the side door 10. The optical unit 400 may provide an image which the window unit 120 faces to the transparent display panel 200 without inverting the image. The optical unit 400 may refract and reflect the light received from the window unit 120 and supply the light to the transmissive areas 220 of the transparent display panel 200.

Figure 4:
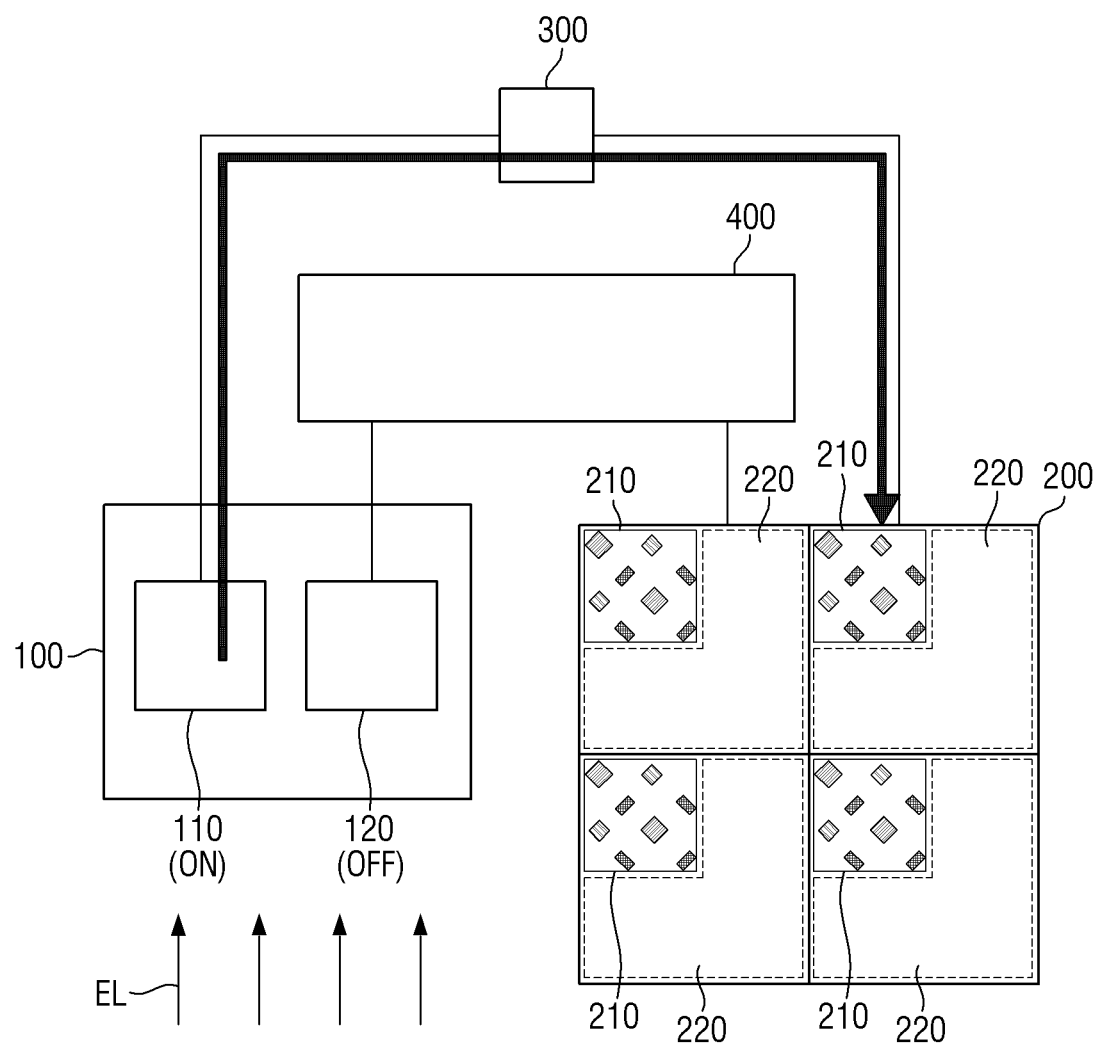
FIG. 4 is a block diagram illustrating a process in which pixel areas of a display device display images on the outside according to an embodiment.

FIG. 4 is a block diagram illustrating a process in which pixel areas of a display device display images on the outside according to an embodiment.

Referring to FIG. 4, the display device may include a light collector 100, a transparent display panel 200, a display driver 300, and an optical unit 400. The light collector 100 may include a camera unit 110 and a window unit 120, and the transparent display panel 200 may include pixel areas 210 and transmissive areas 220.

In a case that the camera unit 110 is turned on and operated (ON), the window unit 120 may be closed (OFF). The camera unit 110 may capture images on the outside based on external light EL outside the vehicle 1. In a case that the camera unit 110 receives a capture signal from the vehicle 1 or the display driver 300 to capture images on the outside, the window unit 120 may be closed and thus may not collect external light. The display driver 300 may drive the pixel areas 210 based on the image data captured by the camera unit 110. In this case, the optical unit 400 cannot receive light from the window unit 120, and thus the transmissive areas 220 of the transparent display panel 200 may not display an image. Accordingly, the pixel area 210 of the transparent display panel 200 may display images on the outside based on the image captured by the camera unit 110, and the transmissive areas 220 may not display images on the outside.

Accordingly, the display device and the vehicle 1 including the same may include the camera unit 110 of the light collector 100, the display driver 300 and the pixel areas 210 of the transparent display panel 200, so that rear and side views of the vehicle 1 may be obtained even without side mirrors. For example, since the display device and the vehicle 1 including the same may include no side mirror, it may be possible to reduce the chances that the vehicle 1 collides with another vehicle or object during traveling or parking. Further, fuel economy may be increased by reducing air resistance, and the aesthetics of vehicle design may be improved.

Figure 5:
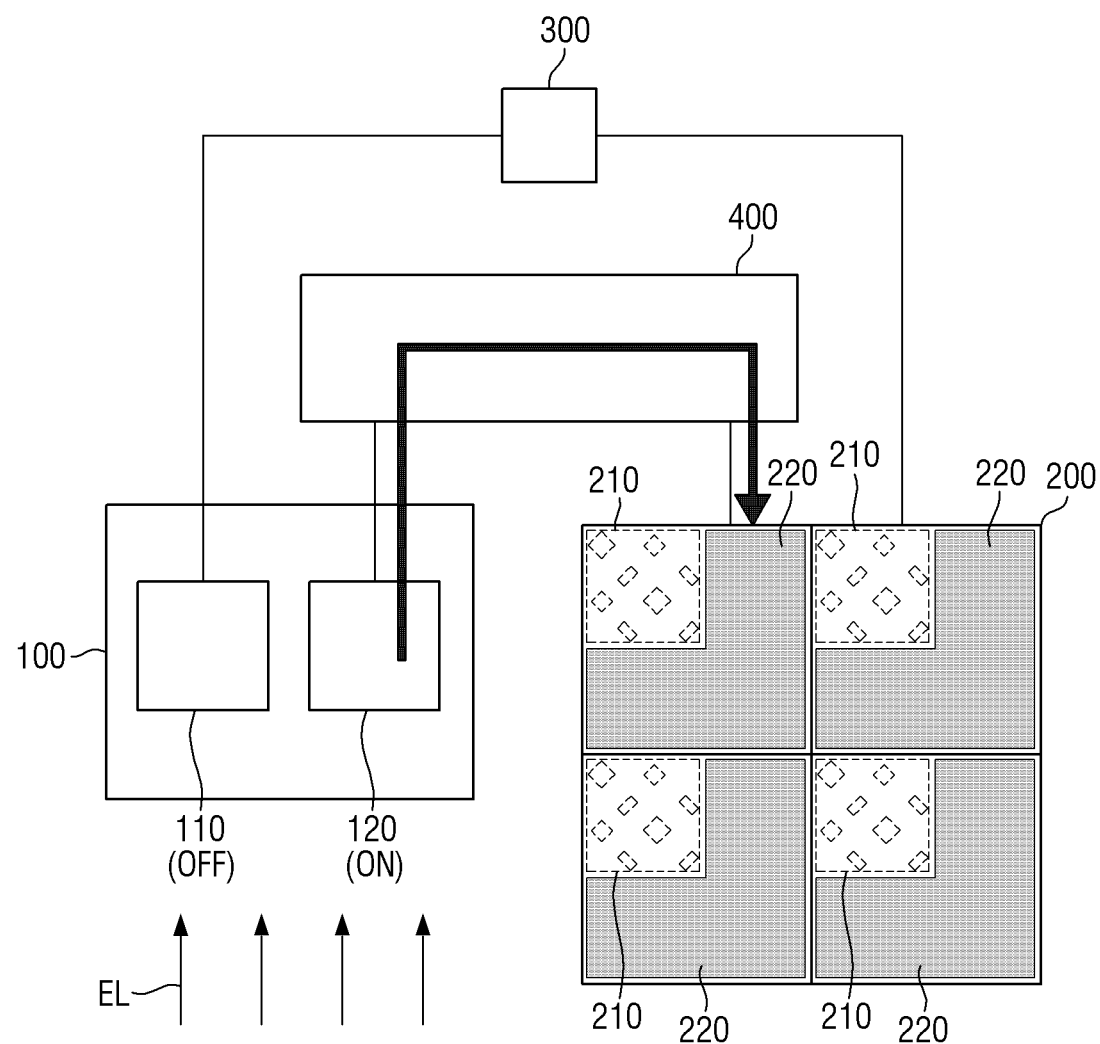
FIG. 5 is a block diagram illustrating a process in which transmissive areas of a display device display images on the outside according to an embodiment.

FIG. 5 is a block diagram illustrating a process in which transmissive areas of a display device display images on the outside according to an embodiment.

Referring to FIG. 5, the display device may include a light collector 100, a transparent display panel 200, a display driver 300, and an optical unit 400. The light collector 100 may include a camera unit 110 and a window unit 120, and the transparent display panel 200 may include pixel areas 210 and transmissive areas 220.

In a case that the camera unit 110 is turned off and is not operated (OFF), the window unit 120 may be open (ON). The window unit 120 and the optical unit 400 may control the path of the external light EL in the vehicle 1 and supply it to the transmissive areas 220 of the transparent display panel 200. In a case that the camera unit 110 does not receive a capture signal from the vehicle 1 or the display driver 300 and thus is not operated, the window unit 120 may be open to collect external light EL. The optical unit 400 may control a path of light received by the window unit 120 and supply it to the transmissive area 220 of the transparent display panel 200. In this case, the display driver 300 may not be operated, and the pixel area 210 of the transparent display panel 200 may not display an image. Accordingly, the transmissive area 220 of the transparent display panel 200 may display images on the outside based on the light received by the window unit 120, and the pixel area 210 may not display images on the outside.

Accordingly, the display device and the vehicle 1 including the same may include the camera unit 120 of the light collector 100, the optical unit 400 and the transmissive areas 220 of the transparent display panel 200, so that rear and side views of the vehicle 1 may be obtained even without side mirrors and even in a case that the vehicle 1 or the system of the vehicle 1 is not operating. Even in a case that the vehicle 1 is turned off or the camera unit 110, the display driver 300 or the pixel areas 210 may not be operated normally, the display device and the vehicle 1 including the display device may provide the driver with rear and side views of the vehicle 1. For example, since the display device and the vehicle 1 including the same may include no side mirror, it may be possible to reduce the chances that the vehicle 1 collides with another vehicle or object during traveling or parking. Further, fuel economy may be increased by reducing air resistance, and the aesthetics of vehicle design may be improved.

Figure 6:
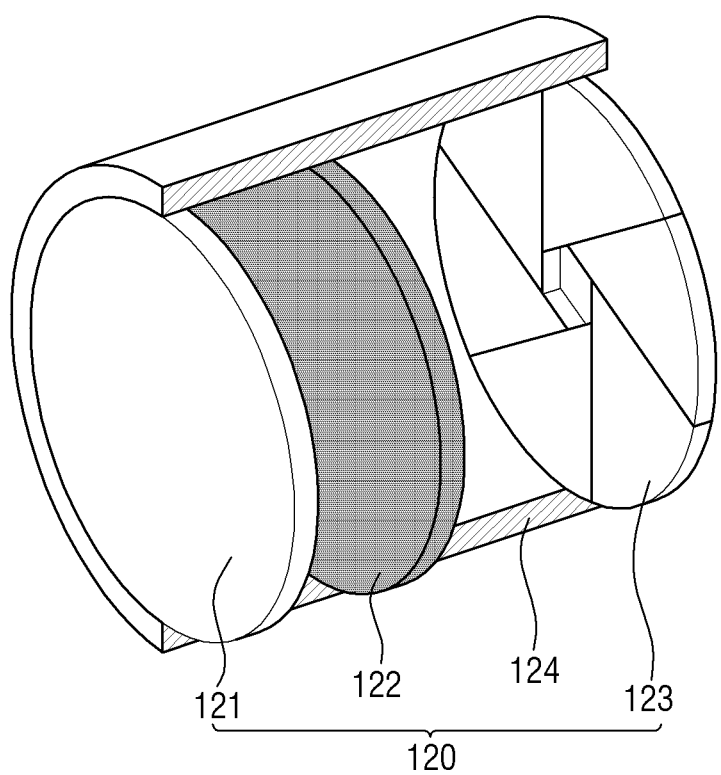
FIG. 6 is a perspective view showing the inside of a window unit of a light collector in a display device according to an embodiment.

FIG. 6 is a perspective view showing the inside of a window unit of a light collector in a display device according to an embodiment.

Referring to FIG. 6, the window unit 120 of the light collector 100 may include a window 121, a shield 122, an iris diaphragm 123, and a housing 124.

The window 121 of the window unit 120 may be exposed to the surface of the light collector 100 and may directly receive external light EL. The window 121 may include a material having a high transmittance, thereby improving transmittance of the external light EL. In a case that the shield 122 of the window unit 120 is not closed, the external light EL may pass through the window 121 and penetrate the inside of the housing 124 to reach the optical unit 400.

The shield 122 of the window unit 120 may be disposed between the window 121 and the optical unit 400, and the window unit 120 may be closed based on whether the camera unit 110 or the display driver 300 is operated. For example, in a case that the camera unit 110 or the display driver 300 is operated, the shield 122 may close the inside of the housing 124 to block the path of the external light EL. On the other hand, in a case that the camera unit 110 or the display driver 300 is not operated, the shield 122 may open the inside of the housing 124 to form the path of the external light EL. The shield 122 may include a light blocking material or a light absorbing material.

The iris diaphragm 123 of the window unit 120 may be disposed between the shield 122 and the optical unit 400 to control the amount of light collected through the window 121. The iris diaphragm 123 may control the area of the path of the light by increasing or decreasing the open area. In a case that the luminance of the external light EL is low, the iris diaphragm 123 may increase the luminance of the transmissive area 220 of the transparent display panel 200 by controlling the area of the light path. For example, the iris diaphragm 123 may also perform the function of the shield 122, in which case, the shield 122 may be eliminated. For another example, the iris diaphragm 123 may be eliminated.

The housing 124 of the window unit 120 may support the window 121, the shield 122 and the iris diaphragm 123, and may provide a path for the external light EL. The housing 124 may block light other than the external light EL incident through the window 121.

Figure 7:
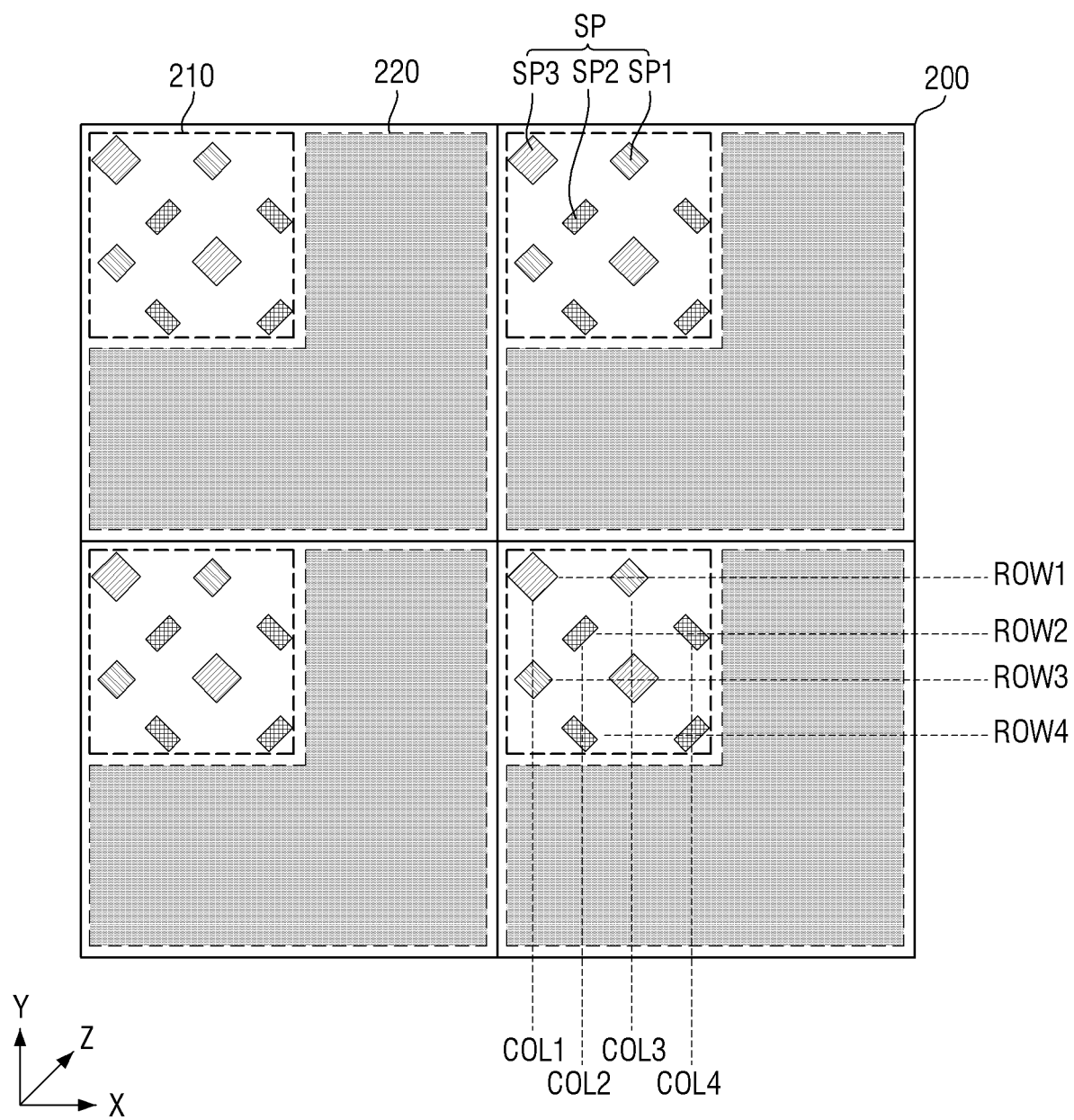
FIG. 7 is a plan view showing a transparent display panel according to an embodiment.

FIG. 7 is a plan view showing a transparent display panel according to an embodiment.

Referring to FIG. 7, the transparent display panel 200 may include pixel areas 210 and transmissive areas 220.

The pixel area 210 may include a plurality of pixels SP, and the plurality of pixels SP may include first to third pixels SP1, SP2 and SP3. The first pixel SP1 may emit light of a first color, the second pixel SP2 may emit light of a second color, and the third pixel SP3 may emit light of a third color. For example, the first color may be red, the second color may be green, and the third color may be blue. It is, however, to be understood that the disclosure is not limited thereto.

An emission area or an opening area of each of the first to third pixels SP1, SP2 and SP3 may have, but is not limited to, a substantially diamond shape or a substantially rectangular shape when viewed from the top. The emission area or the opening area of each of the first to third pixels SP1, SP2 and SP3 may have a substantially polygonal shape other than a substantially quadrangular shape, a substantially circular shape or a substantially elliptical shape when viewed from the top. For example, the emission area of the third pixel SP3 may be the largest, and the emission area of the second pixel SP2 may be the smallest. It is, however, to be understood that the disclosure is not limited thereto.

One first pixel SP1, two second pixels SP2 and one third pixel SP3 may be defined as a single emission group to represent a black-and-white or grayscale level. Accordingly, a grayscale level may be represented by a combination of light emitted from one first pixel SP1, light emitted from two second pixels SP2, and light emitted from one third pixel SP3.

The first and third pixels SP1 and SP3 may be disposed in odd rows and odd columns. The first and third pixels SP1 and SP3 may be alternately arranged or disposed in odd rows. The first and third pixels SP1 and SP3 may be alternately arranged or disposed in odd columns. For example, the first pixels SP1 may be disposed at the intersection of the first row ROW1 and the third column COL3 and at the intersection of the third row ROW3 and the first column COL1. For example, the third pixels SP3 may be disposed at the intersection of the first row ROW1 and the first column COL1 and at the intersection of the third row ROW3 and the third column COL3.

For example, the first pixels SP1 may be adjacent to the third pixels SP3 in the x-axis direction, the opposite direction to the x-axis direction, the y-axis direction perpendicular to the x-axis direction, or the opposite direction to the y-axis direction. For example, the third pixels SP3 may be adjacent to the first pixels SP1 in the x-axis direction, the opposite direction to the x-axis direction, the y-axis direction perpendicular to the x-axis direction, or the opposite direction to the y-axis direction. The plurality of first pixels SP1 and the plurality of third pixels SP3 may surround the second pixels SP2 and may be spaced apart from the second pixels SP2.

The second pixels SP2 may be disposed in even rows and even columns. For example, the second pixels SP2 may be disposed at the intersections of the second row ROW2 and the second column COL2, at the intersection of the second row ROW2 and the fourth column COL4, at the intersection of the fourth row ROW4 and the second column COL2, and at the intersection of the fourth row ROW4 and the fourth column COL4. For example, the second pixels SP2 may be adjacent to the first pixels SP1 in the z-axis direction or the opposite direction to the z-axis direction. The z-axis direction may refer to a direction between the x-axis direction and the y-axis direction. For example, the second pixels SP2 may be adjacent to the third pixels SP3 in the z-axis direction or the opposite direction to the z-axis direction. The plurality of second pixels SP2 may surround the first pixels SP1 or the third pixels SP3 and may be spaced apart from them.

The transmissive areas 220 may display images on the outside using light that has passed through the window unit 120 and the optical unit 400. External light may reach the optical unit 400 through the window unit 120, and the optical unit 400 may control the path of light to supply it to the transparent display panel 200. The transmissive areas 220 may transmit light supplied to the transparent display panel 200 to provide images on the outside to the driver. The transmissive areas 220 may not display an image in a case that the window unit 120 is closed.

A plurality of pixel areas 210 may be spaced apart from one another. The transmissive areas 220 may surround the pixel areas 210, respectively. The transmissive areas 220 may be larger than the pixel areas 210. It is, however, to be understood that the disclosure is not limited thereto. For example, in a case that the pixel areas 210 become larger, the transmissive areas 220 may become smaller, and the overall luminance of the pixel areas 210 of the transparent display panel 200 may be increased. In a case that the overall luminance of the pixel areas 210 increases, images on the outside by the camera unit 110 may be displayed brightly and clearly. For another example, in a case that the pixel areas 210 may be decreased, the transmissive areas 220 may be increased, and the transmittance of the transparent display panel 200 may be increased. In a case that the transmittance of the transparent display panel 200 is increased, images on the outside by the window unit 120 may be displayed brightly and clearly. Accordingly, the ratio of the pixel areas 210 and the transmissive areas 220 may be changed depending on various factors and conditions of the vehicle 1 or the display device.

Figure 8:
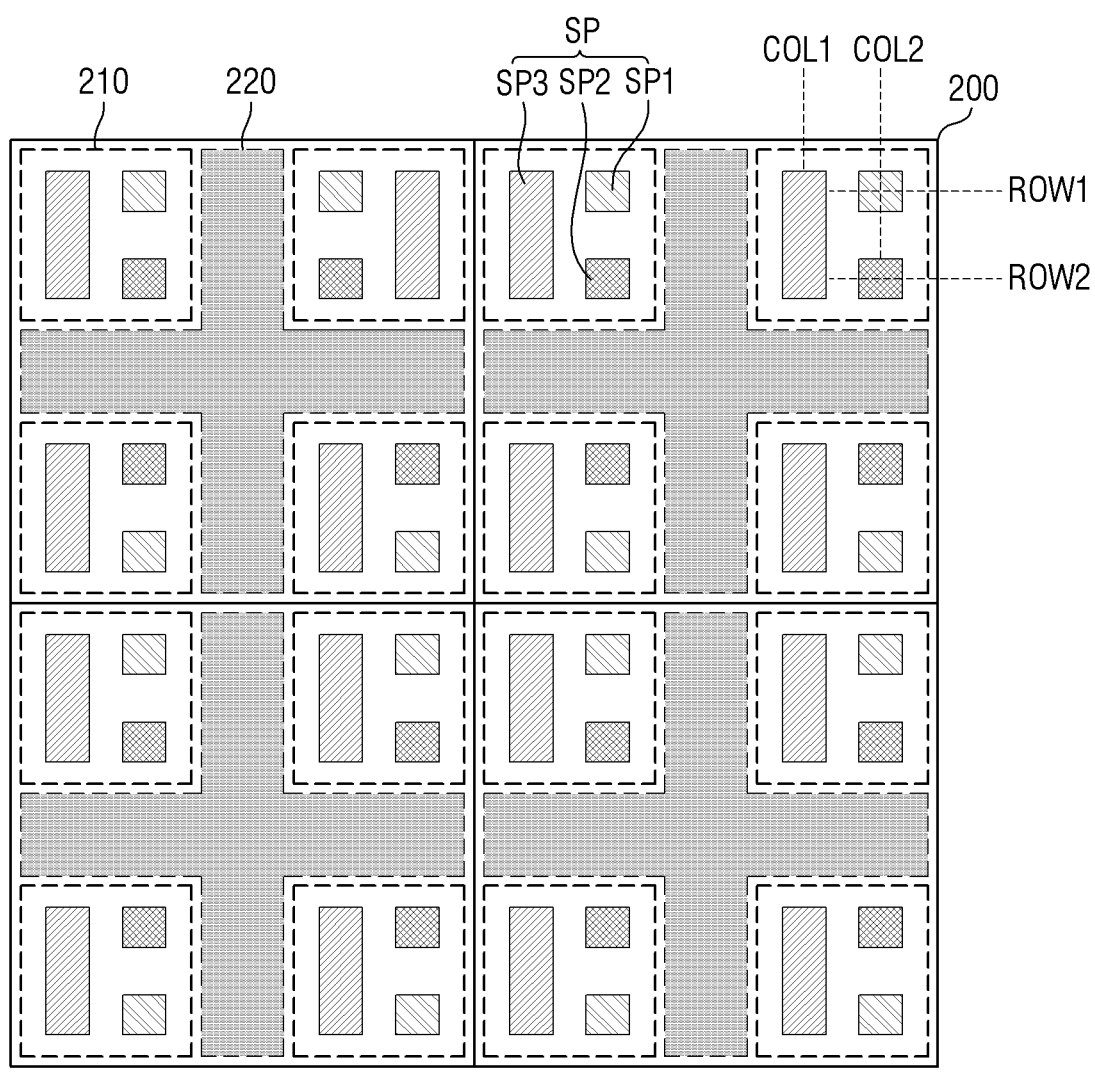
FIG. 8 is a plan view showing a transparent display panel according to an embodiment.

FIG. 8 is a plan view showing a transparent display panel according to an embodiment. The display panel of FIG. 8 is substantially identical to the display panel of FIG. 7 except for the arrangement of first to third pixels; and, therefore, the redundant description will be omitted.

Referring to FIG. 8, the transparent display panel 200 may include pixel areas 210 and transmissive areas 220. Each of the pixel areas 210 may include a plurality of pixels SP, and the plurality of pixels SP may include first to third pixels SP1, SP2 and SP3.

An emission area or an opening area of each of the first to third pixels SP1, SP2 and SP3 may have, but is not limited to, a substantially diamond shape or a substantially rectangular shape when viewed from the top. The emission area or the opening area of each of the first to third pixels SP1, SP2 and SP3 may have a substantially polygonal shape other than a substantially quadrangular shape, a substantially circular shape or a substantially elliptical shape when viewed from the top. The emission area of the third pixels SP3 may be the largest. It is, however, to be understood that the disclosure is not limited thereto.

The first pixels SP1 may be disposed in odd rows and even columns. For example, the first pixels SP1 may be disposed at the intersections of the first row ROW1 and the second column COL2. The first pixels SP1 may be adjacent to the second pixels SP2 in the y-axis direction, and may be adjacent to the third pixels SP3 in the x-axis direction.

The second pixels SP2 may be disposed in even rows and even columns. For example, the second pixels SP2 may be disposed at the intersections of the second row ROW2 and the second column COL2. The second pixels SP2 may be adjacent to the first pixels SP1 in the opposite direction to the y-axis direction, and may be adjacent to the third pixels SP3 in the x-axis direction.

The third pixels SP3 may be disposed in odd columns. The third pixels SP3 may be disposed in the first column COL1. The third pixels SP3 may be adjacent to the first pixels SP1 in the opposite direction to the x-axis direction, and may be adjacent to the second pixels SP2 the opposite direction to the x-axis direction. The size of the emission area of one third pixel SP3 may be larger than the size of the emission area of the first pixel SP1 or the emission area of the second pixel SP2. For example, one third pixel SP3 may be disposed in the first column COL1 and may be extended from the first row ROW1 in which the first pixel SP1 is disposed to the second row ROW2 in which the second pixel SP2 is disposed.

The transmissive areas 220 may display images on the outside using light that has passed through the window unit 120 and the optical unit 400. A plurality of pixel areas 210 may be spaced apart from one another. The transmissive areas 220 may surround the pixel areas 210.

Figure 9:
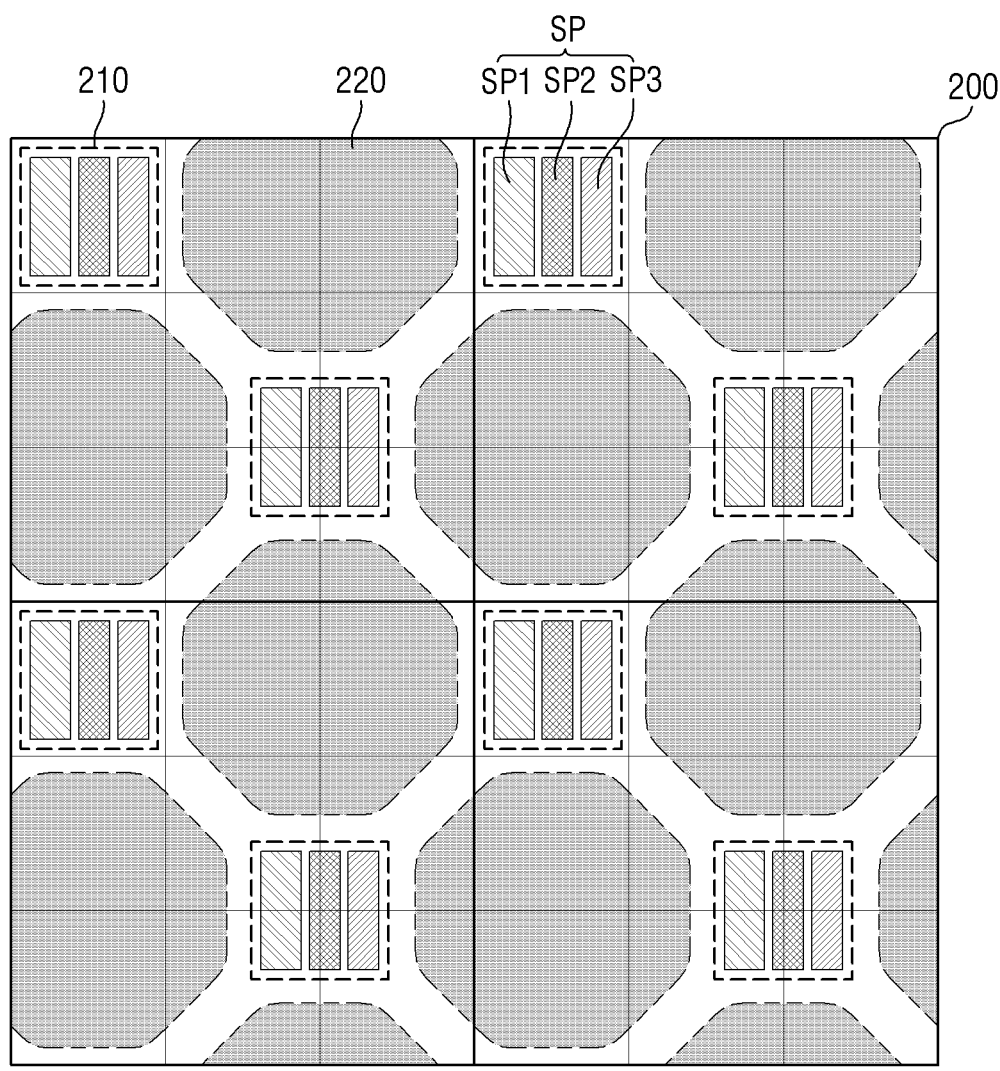
FIG. 9 is a plan view showing a transparent display panel according to an embodiment.

FIG. 9 is a plan view showing a transparent display panel according to an embodiment. The display panel of FIG. 9 is substantially identical to the display panel of FIG. 7 or the display panel of FIG. 8 except for the arrangement of first to third pixels; and, therefore, the redundant description will be omitted.

Referring to FIG. 9, the transparent display panel 200 may include pixel areas 210 and transmissive areas 220. Each of the pixel areas 210 may include a plurality of pixels SP, and the plurality of pixels SP may include first to third pixels SP1, SP2 and SP3.

An emission area or an opening area of each of the first to third pixels SP1, SP2 and SP3 may have, but is not limited to, a substantially diamond shape or a substantially rectangular shape when viewed from the top. The emission area or the opening area of each of the first to third pixels SP1, SP2 and SP3 may have a substantially polygonal shape other than a substantially quadrangular shape, a substantially circular shape or a substantially elliptical shape when viewed from the top. The emission area of the third pixels SP3 may be the largest. It is, however, to be understood that the disclosure is not limited thereto.

The first pixels SP1 may be disposed on one or a side of the pixel areas 210. The second pixels SP2 may be adjacent to the first pixels SP1 in the x-axis direction. The second pixels SP2 may be disposed between the first pixels SP1 and the third pixels SP3. The second pixels SP2 may be disposed in the center of the pixel areas 210. The third pixels SP3 may be disposed on the other side of the pixel areas 210. The third pixels SP3 may be adjacent to the second pixels SP2 in the x-axis direction.

The transmissive areas 220 may display images on the outside using light that has passed through the window unit 120 and the optical unit 400. A plurality of pixel areas 210 may be spaced apart from one another. The transmissive areas 220 may be adjacent to one another and surround each of the pixel areas 210. For example, each of the transmissive areas 220 may be adjacent to the pixel areas 220 in the x-axis direction, the opposite direction to the x-axis direction, the y-axis direction, or the opposite direction to the y-axis direction.

Figure 10:
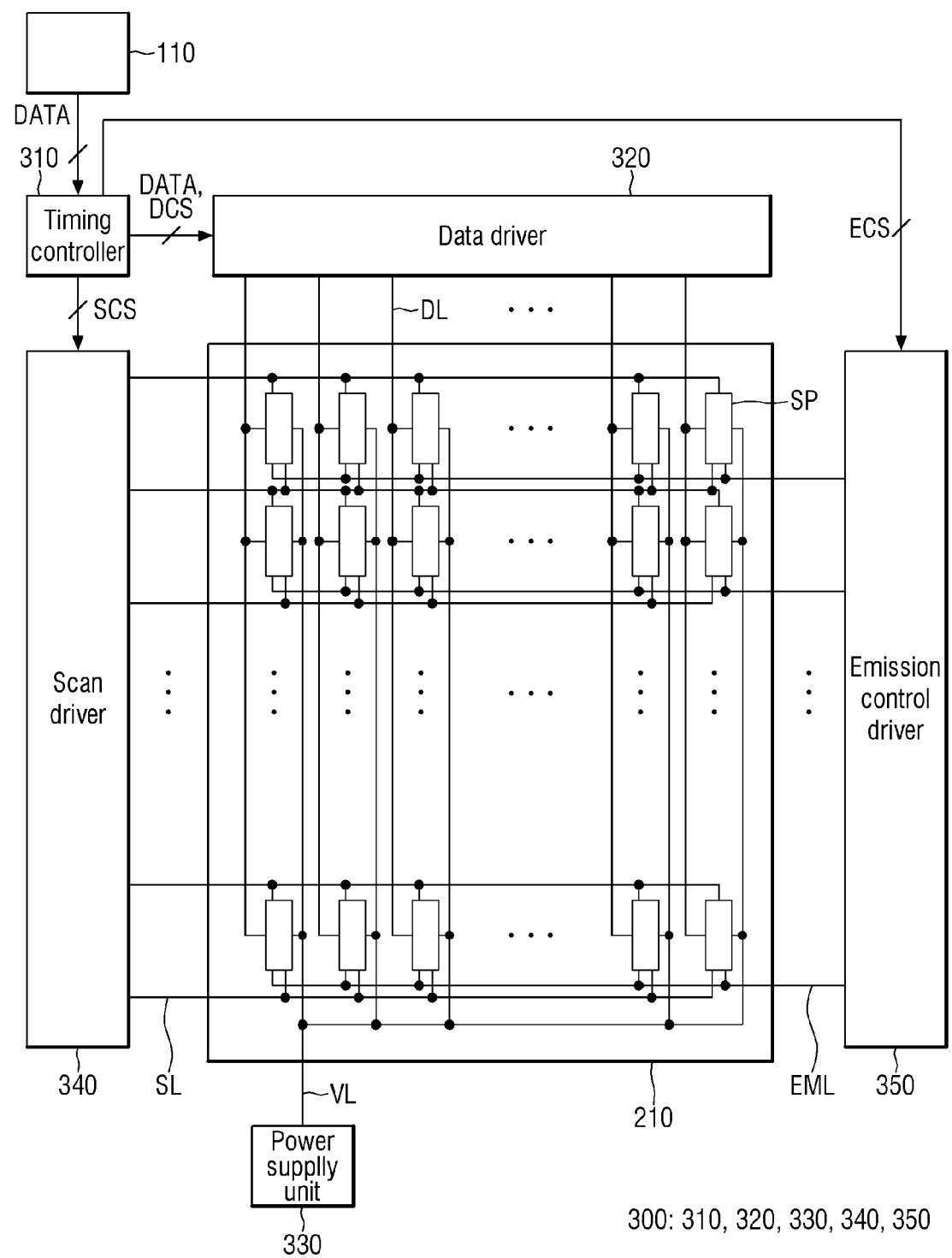
FIG. 10 is a block diagram showing a display driver of a display device according to an embodiment.

FIG. 10 is a block diagram showing a display driver of a display device according to an embodiment.

Referring to FIG. 10, the display driver 300 may include a timing controller 310, a data driver 320, a power supply unit 330, a scan driver 340, and an emission control driver 350.

The timing controller 310 may receive image data DATA captured by the camera unit 110. The timing controller 310 may generate first to third timing signals DCS, SCS and ECS. The timing controller 310 may supply the image data DATA to the data driver 320. The timing controller 310 may control the operation timing of the data driver 320 by supplying the first timing signal DCS to the data driver 320. The timing controller 310 may control the operation timing of the scan driver 340 by supplying the second timing signal SCS to the scan driver 340. The timing controller 310 may control the operation timing of the emission control driver 350 by supplying the third timing signal ECS to the emission control driver 350.

The data driver 320 may generate a data voltage based on the image data DATA received from the timing controller 310. The data driver 320 may supply data voltages to the plurality of pixels SP of the pixel areas 210 through data lines DL. A scan signal from the scan driver 340 may be used to select a pixel SP to which a data voltage is applied, and the selected pixel SP may receive the data voltage through the data line DL.

The power supply unit 330 may supply a driving voltage to the plurality of pixels SP through a voltage supply line VL. For example, the power supply unit 330 may generate the driving voltage to apply it to the voltage supply line VL and may generate a common voltage to supply it to the cathode electrodes of the light-emitting elements of each of the pixel areas 210. For example, the driving voltage may be a high-level voltage for driving the light-emitting element, and the common voltage may be a low-level voltage for driving the light-emitting element.

The scan driver 340 may supply a scan signal to the plurality of pixels SP through the scan lines SL. The scan signal from the scan driver 340 may be used to select a pixel SP to which a data voltage is applied.

The emission control driver 350 may supply an emission control signal to the plurality of pixels SP through emission control lines EML. The emission control signal from the emission control driver 350 may be used to select a pixel SP to which a driving voltage is supplied.

Figure 11:
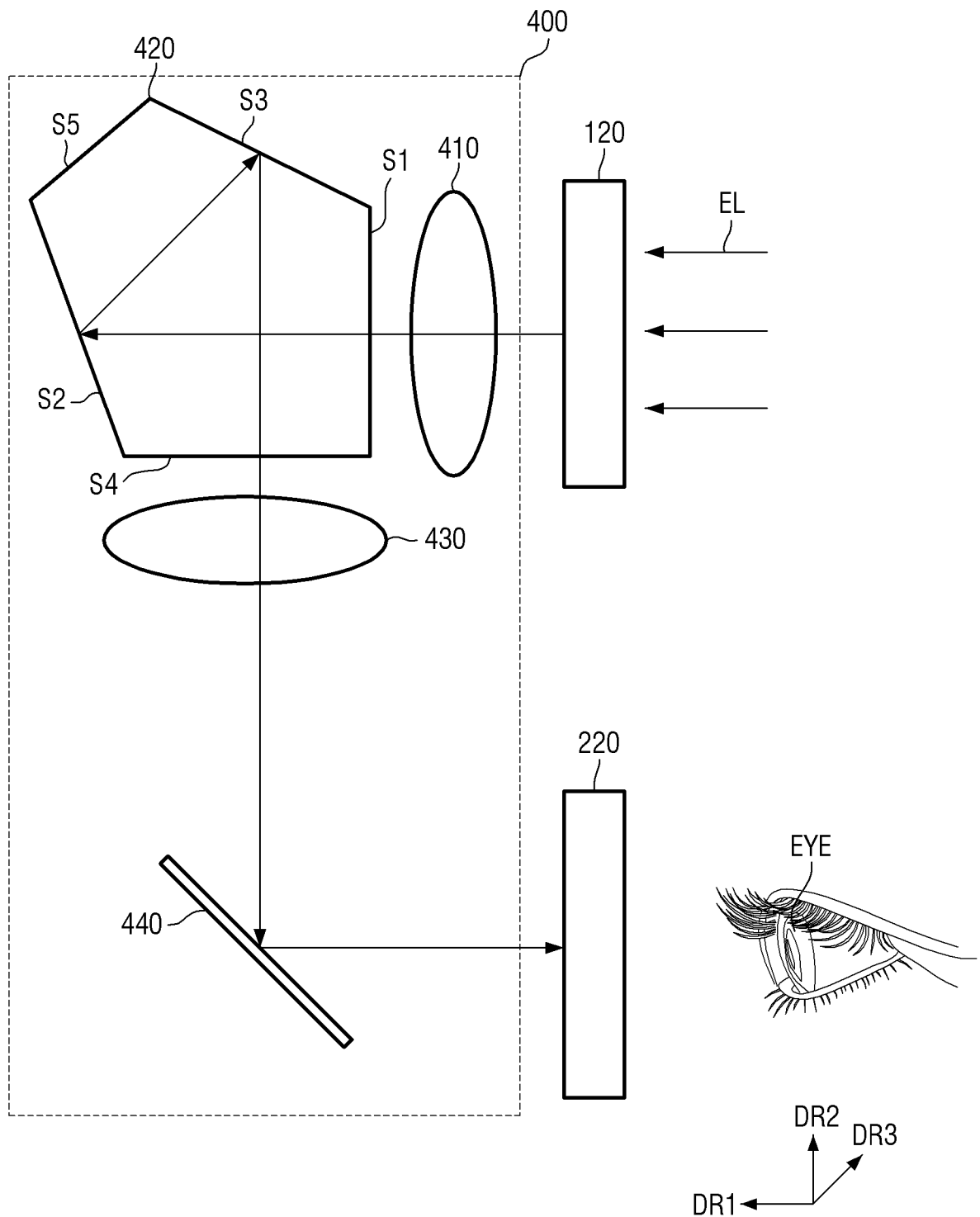
FIG. 11 is a view showing an optical unit of a display device according to an embodiment.

FIG. 11 is a view showing an optical unit of a display device according to an embodiment.

Referring to FIG. 11, the optical unit 400 may control a path of light received from the window unit 120 and supply it to the transmissive area 220 of the transparent display panel 200. The optical unit 400 may include a first lens 410, a light path controller 420, a second lens 430, and a reflective member 440.

The first lens 410 may be disposed between the window unit 120 and the light path controller 420. The first lens 410 may concentrate the external light EL received from the window unit 120. The first lens 410 may transmit or refract the light having passed through the window unit 120 and supply the light to the light path controller 420. For example, the first lens 410 may be, but is not limited to, a plano-convex lens or a biconvex lens.

The light path controller 420 may control the path of light having passed through the first lens 410 and supply it to the second lens 430. The external light EL may pass through the window unit 120 and the first lens 410 to reach the light path controller 420. For example, the window unit 120, the first lens 410 and the light path controller 420 may be disposed on the same line. The light path controller 420 may include first to fifth surfaces S1 to S5.

The first surface S1 may transmit light incident in the first direction DR1 through the first lens 410. Since the first surface S1 is disposed perpendicular to the first direction DR1, the first surface S1 may transmit incident light as it is. The first surface S1 may share one or a side with the third surface S3 or the fourth surface S4.

The second surface S2 may reflect the light having passed through the first surface S1 in a third direction DR3 between a second direction DR2 perpendicular to the first direction DR1 and the opposite direction to the first direction DR1. For example, the second surface S2 is disposed obliquely to the first direction DR1 or the second direction DR2, so that the light having passed through the first surface S1 is reflected toward the third surface S3. The second surface S2 may share one or a side with the fourth surface S4 or the fifth surface S5.

The third surface S3 may reflect light reflected off the second surface S2 in the opposite direction to the second direction DR2. For example, the third surface S3 is disposed obliquely to the first direction DR1 or the second direction DR2, so that the light reflected off the second surface S2 may be reflected toward the fourth surface S4. The third surface S3 may share one or a side with the first surface S1 or the fifth surface S5.

The fourth surface S4 may transmit the light that has been reflected off the third surface S3 and is incident in the opposite direction to the second direction DR2. Since the fourth surface S4 is disposed perpendicular to the second direction DR2, it may transmit the incident light as it is and supply it to the second lens 430. The fourth surface S4 may share one or a side with the first surface S1 or the second surface S2.

For example, the light path controller 420 may be, but is not limited to, a pentaprism which may be a heptahedron having an upper surface, side surfaces of a pentagon, and a lower surface.

The second lens 430 may be disposed between the light path controller 420 and the reflective member 440. The second lens 430 may concentrate the light received from the light path controller 420. The second lens 430 may transmit or refract the light received from the light path controller 420 and supply the light to the reflective member 440. For example, the second lens 430 may be, but is not limited to, a plano-convex lens or a biconvex lens.

The reflective member 440 may reflect light that has passed through the second lens 430 and supply it to the transmissive area 220 of the transparent display panel 200. The light provided from the reflective member 440 may pass through the transmissive area 220 and reach the driver's eyes EYE. Accordingly, the reflective member 440 and the transmissive areas 220 of the transparent display panel 200 may be disposed along the driver's viewing direction.

Figure 12:
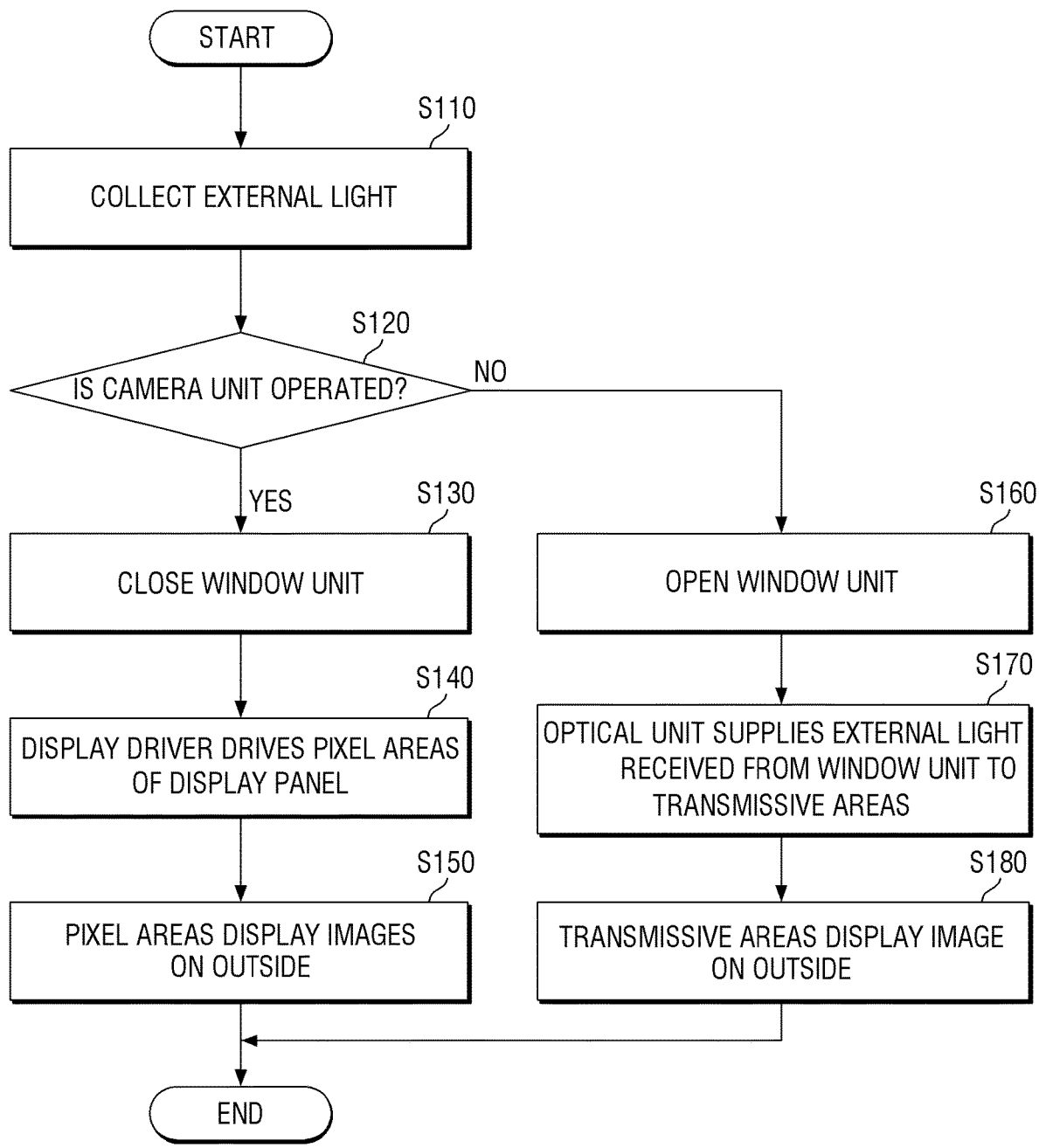
FIG. 12 is a flowchart for illustrating a process of displaying images on the outside in a display device according to an embodiment.

FIG. 12 is a flowchart for illustrating a process of displaying images on the outside in a display device according to an embodiment.

Referring to FIG. 12, a light collector 100 may include a camera unit 110 and a window unit 120 and may collect external light EL (step S110).

A shield 122 of the window unit 120 may open or close the window unit 120 based on whether the camera unit 110 is operated or not (step S120).

For example, in a case that the camera unit 110 is operated, the shield 122 may block the path of the external light EL by closing the inside of the housing 124 of the window unit 120 (step S130).

The display driver 300 may drive the pixel area 210 of the transparent display panel 200 based on the image data captured by the camera unit 110 (step S140).

The pixel area 210 may receive a data voltage, a driving voltage, a scan signal and an emission control signal from the display driver 300 to display images on the outside (step S150).

Accordingly, the display device and the vehicle 1 including the same may include the camera unit 110 of the light collector 100, the display driver 300 and the pixel areas 210 of the transparent display panel 200, so that rear and side views of the vehicle 1 may be obtained even without side mirrors.

For another example, in a case that the camera unit 110 is not operated, the shield 122 may form the path of the external light EL by opening the inside of the housing 124 of the window unit 120 (step S160).

The optical unit 400 may control the path of the external light EL received from the window unit 120 and supply it to the transmissive areas 220 of the transparent display panel 200 (step S170).

The transmissive areas 220 may display images on the outside using the light that has passed through the window unit 120 and the optical unit 400 (step S180).

Accordingly, the display device and the vehicle 1 including the same may include the camera unit 120 of the light collector 100, the optical unit 400 and the transmissive areas 220 of the transparent display panel 200, so that rear and side views of the vehicle 1 may be obtained even without side mirrors and even in a case that the vehicle 1 or the system of the vehicle 1 is not operating. Even in a case that the vehicle 1 is turned off or the camera unit 110, the display driver 300 or the pixel areas 210 may not be operated normally, the display device and the vehicle 1 including the display device may provide the driver with rear and side views of the vehicle 1. For example, since the display device and the vehicle 1 including the same may include no side mirror, it may be possible to reduce the chances that the vehicle 1 collides with another vehicle or object during traveling or parking. Further, fuel economy may be increased by reducing air resistance, and the aesthetics of vehicle design may be improved.

Figure 13:
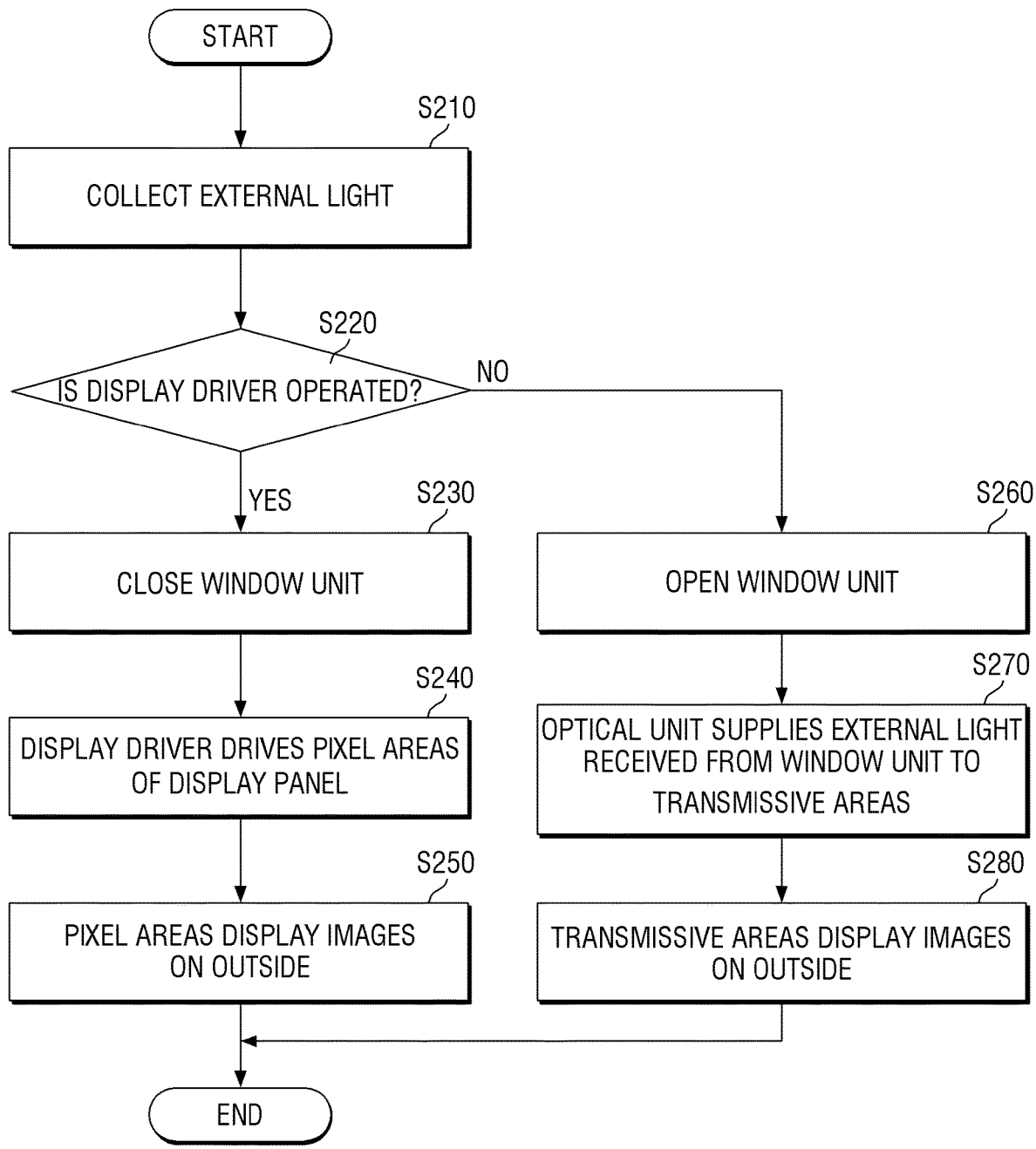
FIG. 13 is a flowchart for illustrating a process of displaying images on the outside in a display device according to an embodiment.

FIG. 13 is a flowchart for illustrating a process of displaying images on the outside in a display device according to an embodiment.

Referring to FIG. 13, the light collector 100 may collect external light EL (step S210).

The shield 122 may open or close the window unit 120 based on whether the display driver 300 is operated or not (step S220).

For example, in a case that the camera unit 110 is operated, the shield 122 may block the path of the external light EL by closing the window unit 120 (step S230).

The display driver 300 may drive the pixel area 210 of the transparent display panel 200 based on the image data captured by the camera unit 110 (step S240).

The pixel areas 210 may be driven by the display driver 300 to display images on the outside (step S250).

On the other hand, in a case that the camera unit 110 is not operated, the shield 122 may form the path of the external light EL by opening the window unit 120 (step S260).

The optical unit 400 may control the path of the external light EL received from the window unit 120 and supply it to the transmissive areas 220 of the transparent display panel 200 (step S270).

The transmissive areas 220 may display images on the outside using the light that has passed through the window unit 120 and the optical unit 400 (step S280).

Figure 14:
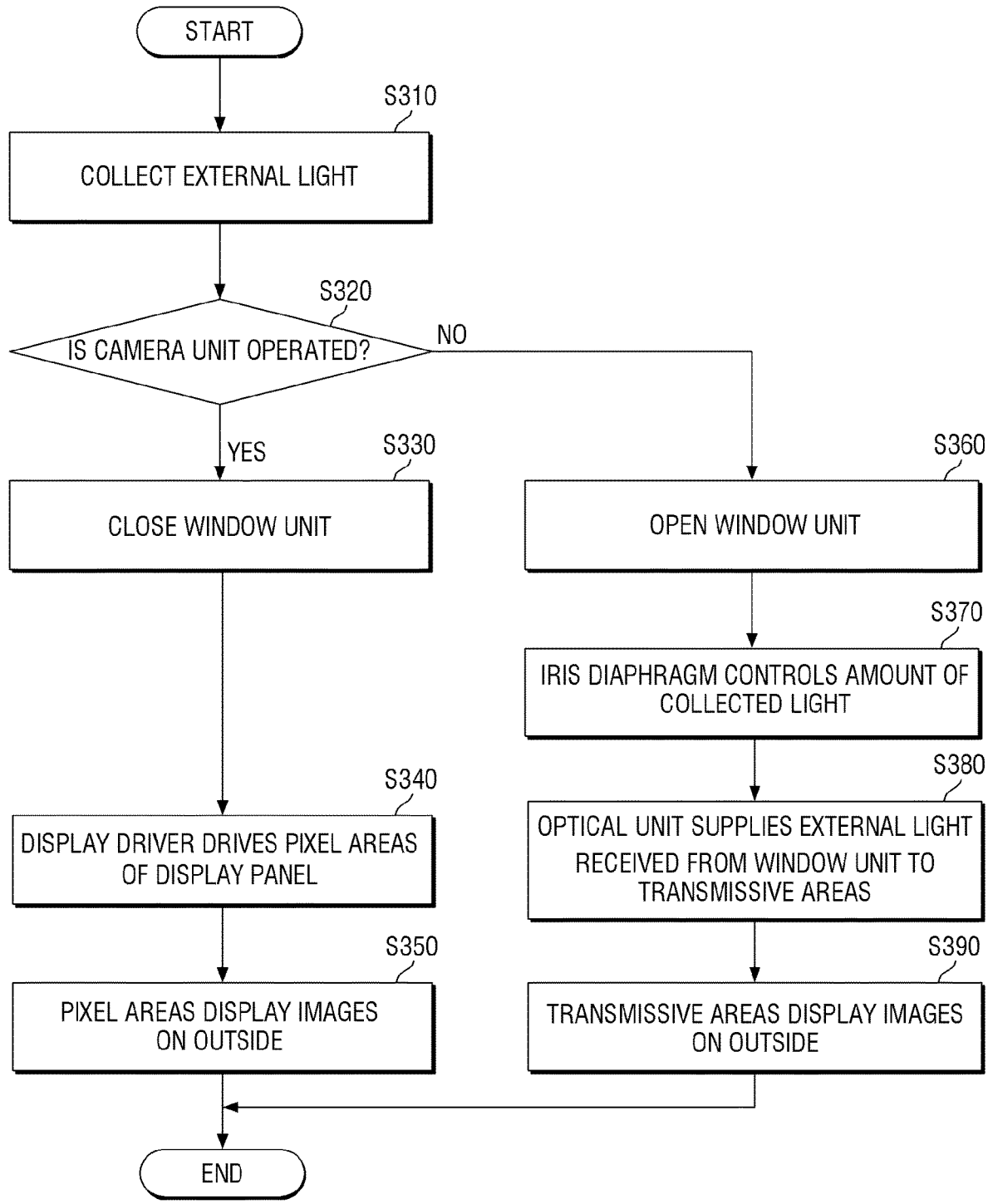
FIG. 14 is a flowchart for illustrating a process of displaying images on the outside in a display device according to an embodiment.

FIG. 14 is a flowchart for illustrating a process of displaying images on the outside in a display device according to an embodiment.

Referring to FIG. 14, the light collector 100 may collect external light EL (step S310).

The shield 122 may open or close the window unit 120 based on whether the camera unit 110 is operated or not (step S320).

For example, in a case that the camera unit 110 is operated, the shield 122 may block the path of the external light EL by closing the window unit 120 (step S330).

The display driver 300 may drive the pixel area 210 of the transparent display panel 200 based on the image data captured by the camera unit 110 (step S340).

The pixel areas 210 may be driven by the display driver 300 to display images on the outside (step S350).

On the other hand, in a case that the camera unit 110 is not operated, the shield 122 may form the path of the external light EL by opening the window unit 120 (step S360).

The iris diaphragm 123 of the window unit 120 controls the amount of light collected through the window 121, so that in a case that the luminance of the external light EL is low, the luminance of the transmissive areas 220 may be increased (step S370).

The optical unit 400 may control the path of the external light EL received from the window unit 120 and supply it to the transmissive areas 220 of the transparent display panel 200 (step S380).

The transmissive areas 220 may display images on the outside using the light that has passed through the window unit 120 and the optical unit 400 (step S390).

What is claimed is:

1. A display device comprising:
   a light collector that includes:
      a camera unit having a camera; and
      a window unit having a window;
   a transparent display panel; and
   an optical unit that controls a path of light received from the window unit to the transparent display panel, wherein
   the transparent display panel comprises:
   at least one pixel area that displays an image based on an image captured by the camera unit; and
   at least one transmissive area that displays an image received from the optical unit,
   the window unit comprises a shield disposed between the window of the window unit and the optical unit, and
   the shield closes the window unit based on an operation of the camera unit, wherein
      the window unit further comprises an iris diaphragm disposed between the shield and the optical unit, and
      the iris diaphragm controls an amount of light collected through the window of the window unit.

2. The display device of claim 1, wherein the window unit is closed when the camera unit is operated and is open when the camera unit is not operated.

3. The display device of claim 1, wherein the optical unit comprises:
   a first lens concentrating the light received from the window unit;
   a light path controller controlling a path of light having passed through the first lens;
   a second lens concentrating the light having passed through the light path controller; and
   a reflective member reflecting the light having passed through the second lens.

4. The display device of claim 3, wherein the light path controller comprises:
   a first surface transmitting light incident in a first direction through the first lens;
   a second surface reflecting the light having passed through the first surface in a third direction between a second direction perpendicular to the first direction and an opposite direction to the first direction;
   a third surface reflecting the light reflected off of the second surface in an opposite direction to the second direction; and
   a fourth surface transmitting the light reflected off of the third surface toward the second lens.

5. The display device of claim 4, wherein the reflective member reflects light incident in the opposite direction to the second direction in the opposite direction to the first direction.

6. The display device of claim 5, wherein the at least one transmissive area receives the light incident from the reflective member to display an image.

7. The display device of claim 1, further comprising a display driver that drives the at least one pixel area based on image data captured by the camera unit.

8. The display device of claim 7, wherein the window unit is closed when the display driver is operated and is open when the display driver is not operated.

9. The display device of claim 7, wherein the display driver comprises:

a timing controller that receives the image data and generates first to third timing signals;
a data driver that receives the image data and the first timing signal from the timing controller and that supplies a data voltage to the at least one pixel area;
a scan driver that receives the second timing signal from the timing controller and that supplies a scan signal to the at least one pixel area; and
an emission control driver that receives the third timing signal from the timing controller and that supplies an emission control signal to the at least one pixel area.

10. The display device of claim 1, wherein
the least one pixel area comprises a plurality of pixel areas spaced apart from one another,
each of the plurality of pixel areas comprises:
a first pixel that emits a first color light;
a second pixel that emits a second color light, the second pixel being adjacent to the first pixel in a first direction or in a second direction perpendicular to the first direction; and
a third pixel that emits a third color light, the third pixel being adjacent to the first pixel in a third direction between the first direction and the second direction, and
the at least one transmissive area comprises a plurality of transmissive areas, and the plurality of transmissive areas surround each of the plurality of pixel areas.

11. The display device of claim 1, wherein
the at least one pixel area comprises a plurality of pixel areas spaced apart from one another,
each of the plurality of pixel areas comprises:
a first pixel that emits a first color light;
a second pixel that emits a second color light, is the second pixel being adjacent to the first pixel in a first direction; and
a third pixel that emits a third color light, the third pixel being adjacent to each of the first pixel and the second pixel in a second direction perpendicular to the first direction, and
the at least one transmissive area comprises a plurality of transmissive areas, and the plurality of transmissive areas surround the plurality of pixel areas.

12. The display device of claim 1, wherein
the at least one pixel area comprises a plurality of pixel areas spaced apart from one another,
each of the plurality of pixel areas comprises:
a first pixel that emits a first color light;
a second pixel that emits a second color light, the second pixel being adjacent to the first pixel in a first direction; and
a third pixel that emits a third color light, the third pixel being adjacent to the second pixel in the first direction, and
the at least one transmissive area comprises a plurality of transmissive areas, and the plurality of transmissive areas surround each of the plurality of pixel areas.

13. A vehicle comprising:
a side door; and
a display device that displays images on an outside of the side door of the vehicle,
wherein the display device comprises:
a light collector comprising a camera unit having a camera and a window unit having a window, the light collector being disposed on an outer side of the side door of the vehicle;
a transparent display panel; and an optical unit that controls a path of light received from the window unit of the light collector to the transparent display panel, wherein the transparent display panel comprising a pixel area that displays an image based on an image captured by the camera unit and a transmissive area that displays an image received from the optical unit, the transparent display panel being disposed on an inner side of the side door of the vehicle, the window unit comprises a shield disposed between the window of the window unit and the optical unit, and the shield closes the window unit based on an operation of the camera unit, wherein the display device further comprises a display driver that drives the pixel area based on the image captured by the camera unit, and the window unit is closed when the display driver is operated and is open when the display driver is not operated.

14. The vehicle of claim 13, wherein the optical unit comprises:

a first lens concentrating light outside of the side door that is received from the window unit;

a light path controller controlling a path of light having passed through the first lens;

a second lens concentrating the light having passed through the light path controller; and a reflective member reflecting the light having passed through the second lens.

15. The vehicle of claim 14, wherein the light path controller comprises:

a first surface transmitting light incident in a first direction through the first lens;

a second surface reflecting the light having passed through the first surface in a third direction between a second direction perpendicular to the first direction and an opposite direction to the first direction;

a third surface reflecting the light reflected off of the second surface in an opposite direction to the second direction; and a fourth surface transmitting the light reflected off of the third surface toward the second lens.

16. The vehicle of claim 15, wherein the reflective member reflects the light incident from the second lens and supplies the reflected light to the transparent display panel disposed on the inner side of the side door of the vehicle.

17. The vehicle of claim 13, wherein the window unit is closed when the camera unit is operated and is open when the camera unit is not operated.

* * * * *